(12) United States Patent
Vincent et al.

(10) Patent No.: US 10,381,295 B2
(45) Date of Patent: Aug. 13, 2019

(54) LEAD FRAME HAVING REDISTRIBUTION LAYER

(71) Applicant: NXP USA, Inc., Austin, TX (US)

(72) Inventors: Michael Vincent, Chandler, AZ (US); Ryan Hooper, Tempe, AZ (US); Dwight Daniels, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 23 days.

(21) Appl. No.: 15/701,572

(22) Filed: Sep. 12, 2017

(65) Prior Publication Data

US 2019/0080991 A1    Mar. 14, 2019

(51) Int. Cl.
*H01L 23/62* (2006.01)
*H01L 23/495* (2006.01)
*H01L 23/00* (2006.01)
*G01L 9/00* (2006.01)

(52) U.S. Cl.
CPC .......... *H01L 23/49575* (2013.01); *G01L 9/00* (2013.01); *H01L 23/49517* (2013.01); *H01L 23/49531* (2013.01); *H01L 23/49548* (2013.01); *H01L 23/49582* (2013.01); *H01L 24/17* (2013.01); *H01L 24/48* (2013.01); *H01L 2224/48247* (2013.01)

(58) Field of Classification Search
USPC .................. 257/666–677, E23.031–E23.059; 438/111, 112, 123
See application file for complete search history.

(56) References Cited

U.S. PATENT DOCUMENTS

| | | | |
|---|---|---|---|
| 5,508,556 A | * | 4/1996 | Lin ................ H01L 23/055 257/691 |
| 6,552,416 B1 | | 4/2003 | Foster |
| 7,745,263 B2 | | 6/2010 | Cusack et al. |
| 7,795,710 B2 | | 9/2010 | Islam et al. |
| 7,825,526 B2 | | 11/2010 | Dirks |
| 8,487,451 B2 | | 7/2013 | Nondhasitthichai et al. |
| 2006/0157866 A1 | * | 7/2006 | Le ................ H01L 25/0657 257/777 |
| 2010/0213589 A1 | * | 8/2010 | Hsieh .............. H01L 21/4832 257/676 |
| 2012/0241915 A1 | * | 9/2012 | Bathan ............. H01L 21/561 257/621 |
| 2013/0099365 A1 | | 4/2013 | Do et al. |
| 2014/0284791 A1 | * | 9/2014 | Do .................. H01L 24/81 257/737 |
| 2016/0372448 A1 | * | 12/2016 | Yazdani ........... H01L 23/147 |
| 2017/0047271 A1 | * | 2/2017 | Zapico ............. H01L 21/565 |

* cited by examiner

*Primary Examiner* — Niki H Nguyen
(74) *Attorney, Agent, or Firm* — Senaida B. San Miguel

(57) ABSTRACT

Embodiments of a packaged semiconductor device are provided, which includes a flag of a lead frame having a top surface and a bottom surface; a redistribution layer (RDL) structure formed on the top surface of the flag, the RDL structure including a first connection path having a first exposed bonding surface in a top surface of the RDL structure; and a first wirebond connected to the first exposed bonding surface and to a lead of the lead frame.

20 Claims, 12 Drawing Sheets

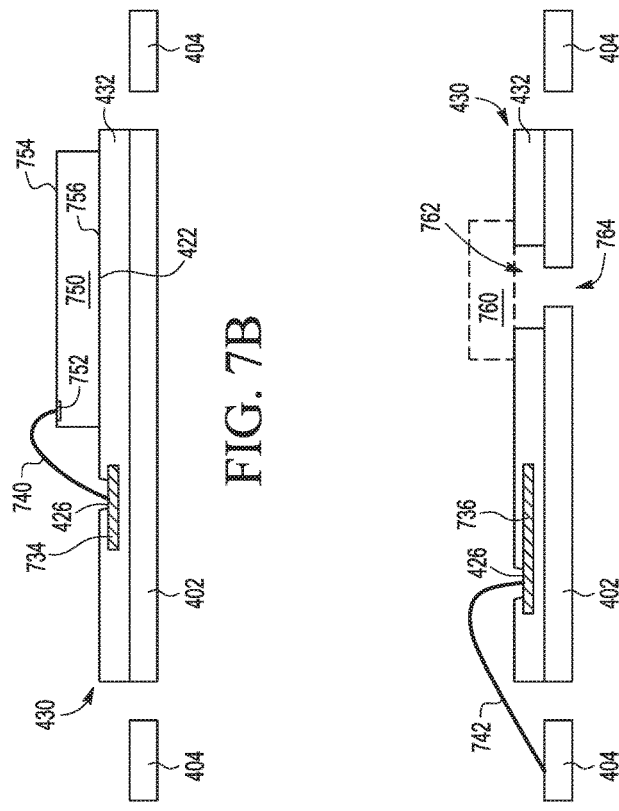
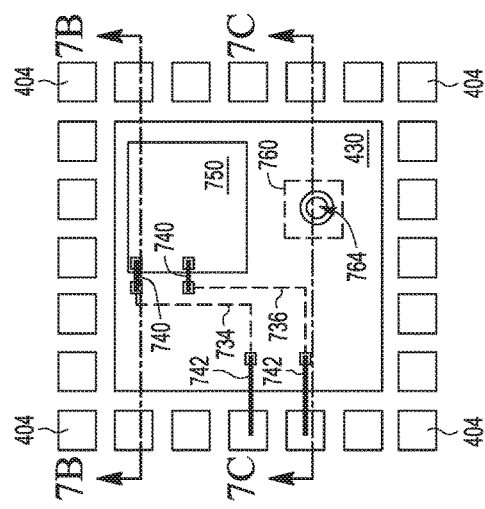

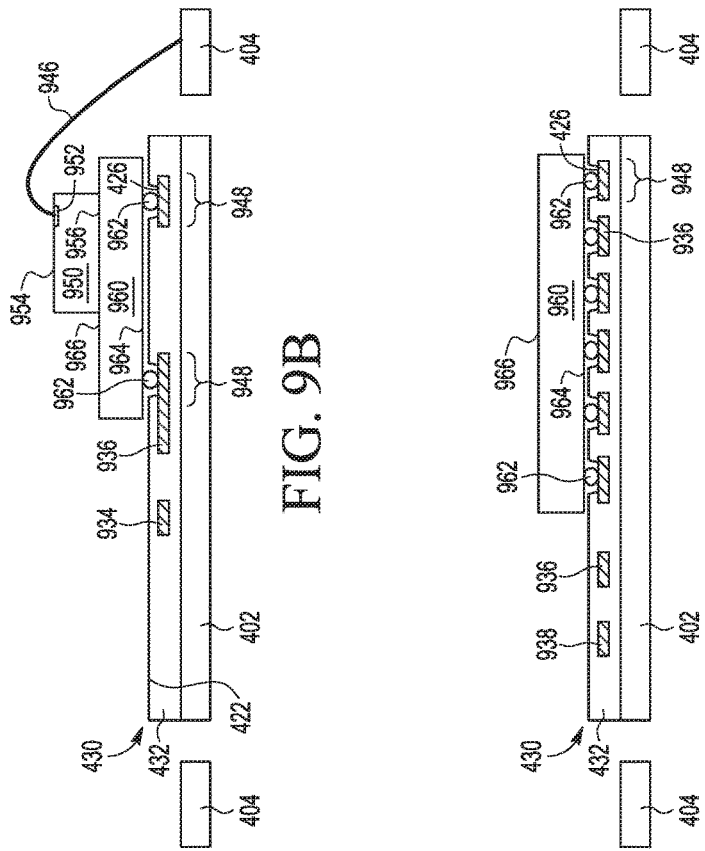
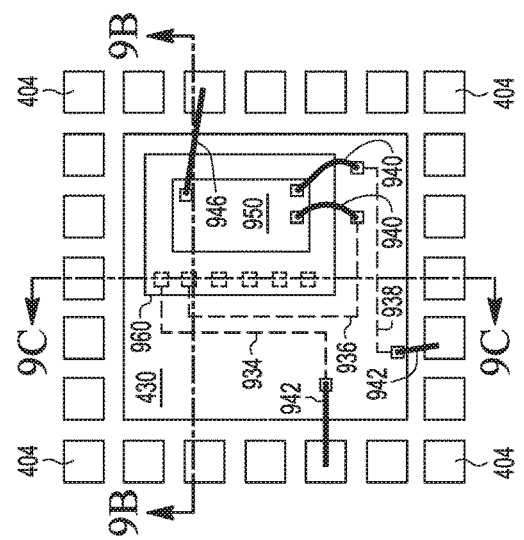
FIG. 9A
FIG. 9B
FIG. 9C

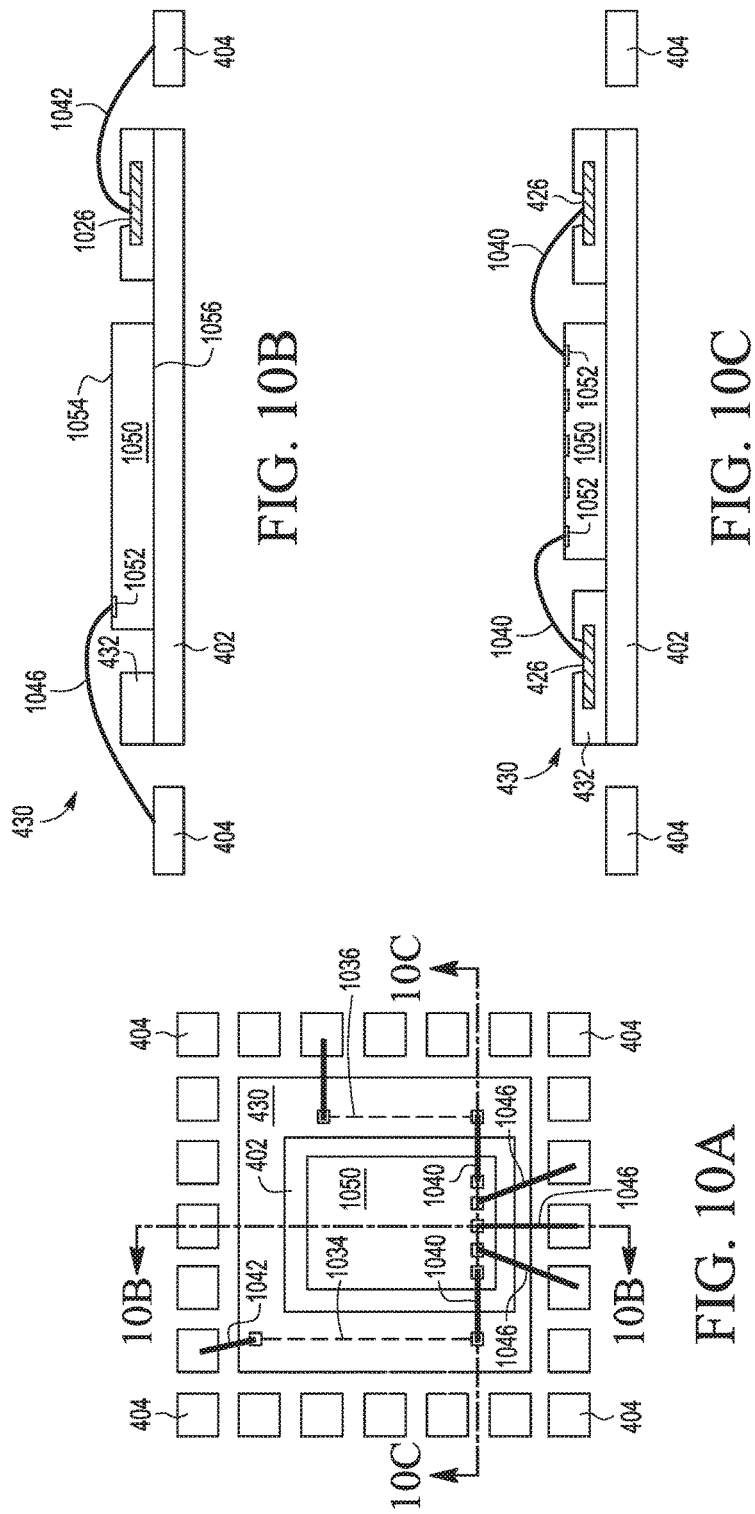

LEAD FRAME HAVING REDISTRIBUTION LAYER

BACKGROUND

Field

This disclosure relates generally to packaged semiconductor devices built on lead frames, and more specifically, to packaged semiconductor devices that include a redistribution layer (RDL) structure on the lead frame.

Related Art

A semiconductor die is a small integrated circuit (IC) formed on a semiconductor wafer, such as a silicon wafer. Such a die is typically cut from the wafer and packaged using a lead frame. The lead frame is a metal frame that supports the die and provides external electrical connections for the packaged die. The lead frame usually includes a flag (or die pad) and lead fingers (or leads). The semiconductor die is attached to the flag and bond pads on the die are electrically connected to the leads of the lead frame with bond wires. The die and bond wires are covered with an encapsulant to form a semiconductor die package. The leads either project outwardly from the encapsulation or are at least flush with the encapsulation so they can be used as terminals, allowing the packaged die to be electrically connected to other devices or a printed circuit board (PCB).

BRIEF DESCRIPTION OF THE DRAWINGS

The present invention may be better understood, and its numerous objects, features, and advantages made apparent to those skilled in the art by referencing the accompanying drawings.

FIGS. 7A-7C, 8A-8C, 9A-9C, 10A-10C, 11A, 11B, 12A, and 12B illustrate block diagrams depicting various example semiconductor devices in which the present disclosure is implemented, according to some embodiments.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
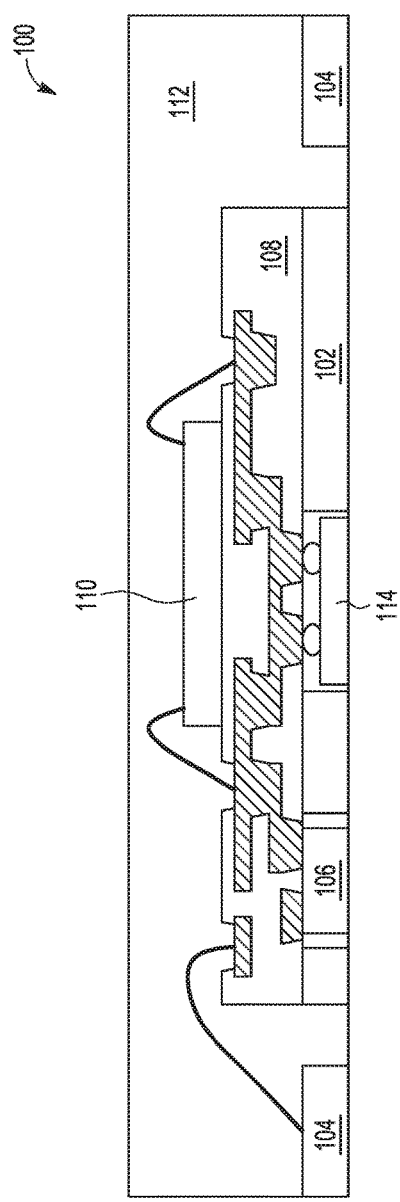
FIG. 1 illustrates a block diagram depicting an example packaged semiconductor device in which the present disclosure is implemented, according to some embodiments.

The following sets forth a detailed description of various embodiments intended to be illustrative of the invention and should not be taken to be limiting.

Overview

Lead frames provide a platform to assemble die into a packaged semiconductor device, which provides input/output (I/O) connections to interconnect the die with a printed circuit board (PCB). The flag of the lead frame can be used to connect ground to ground pads on the die, but cannot be used to route signals and power. This is a disadvantage compared to substrate-based packages that have the ability to route signal and power underneath the footprint of the die. This limited ability to route signals and power also greatly constrains integration of any additional electronic components into such packaged semiconductor devices, since a lead frame of a given size has a limited number of leads for both I/O connections and internal connections between the die and the electrical component. Instead, such integration would require a lead frame with a larger number of leads (which, in turn, causes the package size to grow), despite the flag of a lead frame with fewer leads providing adequate space to mount the die and various electronic components.

Additionally, it is generally cost advantageous to reuse existing packaging platforms (and their associated test hardware) to assemble die, where the existing packaging platforms have leads arranged according to a particular pin layout for attachment to a PCB. However, as new die are developed, the new die may implement a different layout than its predecessors, where the bond pad arrangement of the new layout may not align with the pin layout provided by the existing lead frame. This misalignment may require formation of overlong wirebonds between the bond pads and the leads, which increases the likelihood of wire deformation or breakage. Substrate-type interposers may be used to provide some rerouting of signals to the pin layout, but may be costly in time and expense to fabricate, driving up the cost of the package. Further, interposers add overall height to the package, unnecessarily increasing the size of the package.

The present disclosure provides embodiments of a lead frame having a redistribution layer (RDL) structure formed on a flag of the lead frame. The RDL structure is formed from a number of dielectric and metal layers that in turn form a number of metal connection paths extending through the RDL structure. The RDL structure is preferable to an interposer due to the RDL structure's minimized height (e.g., one to three layers of material) and cost of manufacture, with the additional benefit of flexible customization of the layout of connection paths in the RDL structure up until the time of fabrication on the flag (e.g., as opposed to stopping production until a suitable interposer is created, shipped, and received), resulting in a faster time-to-market.

Each connection path may have one or more exposed surfaces to which a wire can be bonded (also referred to herein as bondable surfaces), which are used to implement external and internal electrical connections for the die. For example, an external electrical connection may be implemented by a connection path and two wirebond connections, where the connection path has a bondable surface at either end of the path, where one bondable surface is connected to a bond pad of a die by a first wirebond connection (which, as used herein, is where opposite ends of a wire are respectively connected to the bondable surface and to the bond pad), and the other bondable surface is connected to a lead by a second wirebond connection. The wirebond connections and the connection path provide a signal routing path from the die to the lead, which provides customizable routing for the die to distant leads that are inappropriate for direct wirebonding to the die. An internal electrical connection between the die and an electronic component may similarly be implemented by a connection path and two wirebond connections, where the second wirebond connection is connected to a bond pad of the electronic component (rather than to a lead). Similarly, the signal routing path from the die to the electronic component provides customizable routing that can interconnect the die and electronic component in disparate locations, which may not normally be possible on a standard lead frame.

The die or various electronic components may be mounted on the top surface of the RDL structure or may be mounted onto the top surface of the flag itself, depending on design considerations. For example, the die may be a flip chip die (or a die that has chip pads to which solder bumps are attached), where multiple bondable surfaces are exposed in the top surface of the RDL structure for flip chip (face-down) attachment, in some embodiments. In other embodiments, the die may be a wirebondable die (or a die that has bond pads to which wires can be bonded) that has a back side that may be mounted to the flag itself in face-up attachment, with the RDL structure located laterally to the die. Further, wirebondable die may even be mounted face-down on the top surface of the RDL structure in a manner comparable to the flip-chip attachment, where connection paths through the RDL structure provide bondable surfaces that can be wire-bonded to leads. In embodiments where the (flip chip or wirebondable) die is attached to the top surface of the RDL structure (in either face-up or face-down orientation), the connection paths that extend through the RDL structure can be routed underneath the footprint of the die. The presence of the RDL structure allows almost unlimited flexibility in the layout of the die and electronic components and the routing of signals among the die, any electronic components, and the leads.

The present disclosure also provides for a double-sided assembly. The RDL structure is formed over at least a portion of a top surface of the flag. After overmolding, an opening is etched or otherwise formed in the bottom surface of the flag, where the opening goes through the flag and exposes a bottom surface of the RDL structure. A number of bondable surfaces of the connection paths may then be exposed within the opening, and an electronic component may be attached within the opening to the bondable surfaces. The connection paths may interconnect the electronic component on the bottom side of the RDL structure with electronic components on the top side of the RDL structure, with electronic components on the top side of the flag, or with the leads. Additionally, other openings may be etched into the flag to leave portions of the flag as traces in contact with metal layers on the bottom side of the RDL structure, providing further customizable routing.

Example Embodiments

FIG. 1 shows a cross-sectional view of an example packaged semiconductor device 100 in which the present disclosure is implemented. Device 100 is fabricated on a lead frame that includes a flag 102 and a plurality of leads 104. Although a QFN (quad flat no-lead) lead frame is shown in FIG. 1 and throughout the drawings, it is noted that any other type of lead frame or chip carrier may be used, including but not limited to DFN (dual flat no-leads), QFP (quad flat package), DIP (dual in-line package), QIP (quad in-line package), SOIC (small outline integrated circuit), and other leaded (e.g., leads extend beyond the package outline) or leadless (e.g., leads remain within package outline, providing exposed surfaces as metal pads for surface mounting) chip carriers.

A redistributed layer (RDL) structure 108 is fabricated on the flag 102, which includes a number of dielectric layers and metal layers to form one or more connection paths through the RDL structure. The metal layers are illustrated in the figures as areas with hatching. The RDL structure is formed using a sequence of numerous process steps applied to the flag, including but not limited to depositing semiconductor materials including dielectric materials and metals, such as growing, oxidizing, sputtering, and conformal depositing, etching semiconductor materials, such as using a wet etchant or a dry etchant, performing photolithography for patterning, including depositing and removing photolithography masks or other photoresist materials, laminating, dispensing, printing, jetting, spraying, and the like.

The connection paths through the RDL structure 108 provide internal electrical connections between various electrical components of the device 100, as well as external electrical connections between such electrical components and leads 104 (which may be connected to the PCB). As shown in FIG. 1, a die 110 is mounted or attached by die attach material to a top surface of RDL structure 108. The RDL structure 108 includes a number of bondable surfaces exposed through the top surface of the RDL structure 108. Bond pads on the die 110 are connected to respective exposed surfaces (or bondable surfaces) of various connection paths by wirebond connections. In the embodiment shown, the bondable surfaces are exposed through a top dielectric layer of the RDL structure 108, although in other embodiments, the (top) surface of the connection paths may not be covered by any dielectric layer (e.g., a top exposed metal layer provides a bond pad or trace). Also, in other embodiments, the die 110 may instead be mounted or attached by die attach material directly to the top surface of the flag 102 with the RDL structure 108 situated around or next to the die 110. The die 110 and wirebonds are then overmolded by mold compound to produce the packaged semiconductor device shown in FIG. 1.

The connection paths are formed from an electrically conductive material, examples of which include but are not limited to nickel, gold, copper, aluminum, or other suitable conductive metal or alloy composed of one or more suitable conductive metals. The exposed surfaces on the RDL structure 108 may be coated with an electrically conductive material, examples of which include nickel, gold, copper, aluminum, tin, silver, titanium, or other suitable conductive metal or alloy composed of one or more suitable conductive metals in order to improve the "bondable" nature of the exposed surface. The lead frame is also formed from an electrically conductive material, such as copper or other suitable conductive metal or alloy composed of one or more suitable conductive metals. Examples of die attach material include but are not limited to polymer adhesives, epoxies, solders, pastes, films, tailored die cut tapes, and the like. Thermal interface material (TIM) may also be used as the die attach material in embodiments when the die is attached to the flag, where TIM is heat conductive, allowing the flag to also act as a heat sink for the die.

Examples of the various electrical components include one or more semiconductor die (like die 110), which may be a wirebondable die or a flip chip die. A semiconductor die (such as a wirebondable die or flip chip die) described herein can be any semiconductor material or combinations of materials, such as gallium arsenide, silicon germanium, silicon-on-insulator (SOI), silicon, monocrystalline silicon, the like, and combinations of the above. The active circuitry for the semiconductor die (including bond pads) is formed using a sequence of numerous process steps applied to a semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like.

Additional examples of electronic components include but are not limited to a processor, memory, logic, analog circuitry, sensor (such as a pressure sensor), MEMS (microelectromechanical systems) device, a standalone discrete device such as a resistor, inductor, capacitor, diode, power transistor, surface mounted devices, and the like. In some embodiments, the active circuitry of the semiconductor die may be a combination of the integrated circuit components listed above or may include other types of microelectronic devices.

Electrical components may also be integrated into device 100 through the back side of the flag 102, such as electrical component 114. FIG. 1 also shows an example trace 106 that is created by etching an opening around the intended placement of the trace 106, where the trace 106 remains in contact with a portion of bottom metal layers in the RDL structure 108. The electrical components 114 and traces 106 on the back side may be further surrounded by mold compound 112, as further discussed below in connection with FIGS. 13A-13D and 14A-14C.

FIG. 2A-2F show cross-sectional views that are representative of various steps of an example process for fabricating a redistributed layer (RDL) structure on a lead frame 200, which includes a flag 202 and leads 204. It is noted that the lead frame 200 shown in FIG. 2A-2F may be an example single lead frame that is part of an array of lead frames, where the process steps discussed herein are implemented on all lead frames of the array. The lead frame shown in FIG. 2F may also be representative of a single lead frame singulated from the array of lead frames.

Figure 2A:
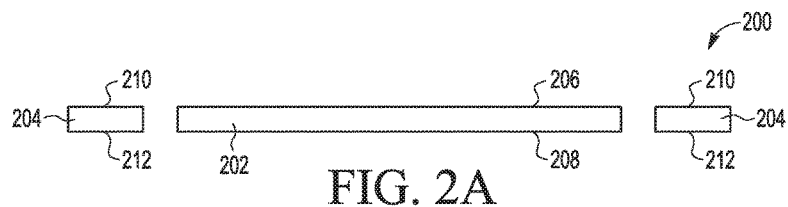
FIG. 2A-2F illustrate block diagrams depicting an example process for fabricating a redistributed layer (RDL) structure on a lead frame, according to some embodiments.

FIG. 2A shows a flag 202 having a top surface 206 and a bottom surface 208. Leads 204 similarly have a top surface 210 and a bottom surface 212. Flag 202 and leads 204 are laterally separated or spaced from one another. While not shown, one or more leads 204 may also be connected to the flag 202. While flag 202 and leads 204 are shown as having a same thickness (e.g., measured between respective top and bottom surfaces), it is noted that flag 202 may have a different thickness than leads 204 in other embodiments. For example, in an embodiment having one or more openings (for electrical components, as discussed below) or traces (also discussed below) etched into the flag 202, the flag 202 may be half-etched (e.g., may be etched to a thickness that is less than the original thickness of the flag 202 and leads 204, such as the flag 202 being half as thick as the leads 204) prior to formation of the RDL structure on the flag 202. Also, while the flag 202 and leads 204 are shown as being co-planar, the flag 202 and leads 204 may be at different elevations in other embodiments. For example, the flag 202 may be down-set or up-set from the leads 204 by some vertical distance.

Figure 2B:
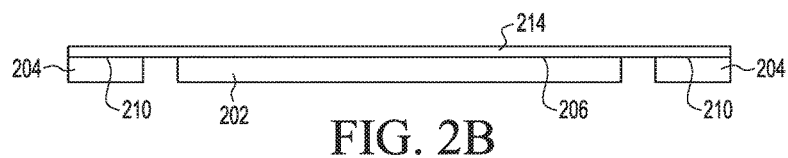

FIG. 2B shows a dielectric layer 214 deposited over (e.g., deposited directly on) the top surfaces 206 and 210 of the lead frame 200. Dielectric layer 214 is a layer of insulating material that may be conformally deposited over the lead frame 200 in some embodiments, spun-on over the top surfaces of the lead frame 200 in other embodiments, and grown on the top surface of the flag 202 in yet other embodiments. While the dielectric layer 214 is shown spanning the spacing between the flag and the leads, such coverage is dependent on the deposition technique and the thickness of the dielectric layer 214. In other words, a thinner dielectric layer 214 or a grown dielectric layer 214 may not span the spacing.

Figure 2C:

FIG. 2C shows a portion of the dielectric layer 214 remaining on the flag 202, while portions of the dielectric layer 214 are removed from areas outside of the flag 202 (e.g., removed from the top surfaces 210 of the leads 204, and removed from the spacing between the flag and the leads, if present). Also, while the dielectric layer 214 is shown as covering the entirety of the flag 202, the dielectric layer 214 may be smaller than the flag 202 in other embodiments. For example, the dielectric layer 214 may be patterned to remain in an area around an intended location of an electrical component (e.g., around a die, shown in FIGS. 10A and 11) or between the intended locations of two electrical components (e.g., between die, shown in FIG. 12A).

FIG. 2C also shows one or more conductive ink traces 216 formed on the top of dielectric layer 214. The conductive ink traces 216 are used to form a first layer of routing or connection paths on the dielectric layer 214, as discussed below. The conductive ink used to form the one or more conductive ink traces 216 may be a paste that includes nanoparticles of conductive metal suspended in a liquid (such as deionized water). The liquid is then vaporized during laser sintering, as discussed below. The conductive ink can be applied to a large target area on dielectric layer 214 in which the connection paths are to be formed, or may be applied along each targeted connection path itself. The conductive ink traces 216 may be applied by ink jetting or printing, spraying, tape lamination, or otherwise deposited on the dielectric layer 214. Examples of the conductive metal include but are not limited to copper, aluminum, silver, gold, an alloy or composite of one or more suitable conductive metals, and the like. The viscosity of the paste is thick enough to prevent the paste from any undesired spreading away from the targeted connection paths, as well as achieve a thickness or height of the resulting conductive traces.

Figure 2D:
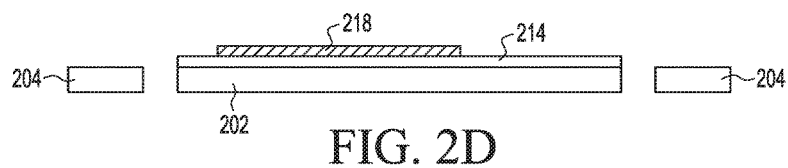

FIG. 2D shows the resulting one or more metal traces 218 after sintering the one or more conductive ink traces 216. In some embodiments, the metal traces 218 are formed by a sintering system that directs a laser beam to raster or vector over each target connection path on the dielectric layer 214. The laser beam applies heat (which is below the melting point of the conductive metal) to the paste, which fuses the nanoparticles of conductive metal along the laser beam path into a metal trace 218. The laser sintering system may achieve fine conductive traces, having a width as small as 1 micron (e.g., width measured in the XY plane of the flag). However, greater widths may be used to achieve a larger area or surface to which a wirebond can be attached, as discussed below. If the paste is applied to a large area of the dielectric layer 214, the remaining paste should be rinsed off of the dielectric layer 214 after formation of the metal traces 218 in the area.

In other embodiments, the conductive ink traces 216 may be sintered using an intense pulsed light (IPL) flash lamp. In such an embodiment, the paste is applied along each target connection path itself (rather than to a larger area in which the target connection paths are located). Such an embodiment may not require a rinsing step. In yet other embodiments, the conductive ink traces 216 may be sintered by heat using a conventional oven, such as a box oven, convection oven, solder-reflow oven, and the like.

Although not shown, a vision system may be used to align the sintering system to the lead frame (or lead frame array) in order to accurately maneuver a laser beam along the target connection paths to form metal traces 218. A vision system may also be used to ensure that the conductive ink is accurately applied along each target connection path on the dielectric layer 214. It is also noted that the sintering system may include multiple laser beams or IPL flash lamps or mirrors to sinter traces on multiple lead frames of the array in parallel.

In other embodiments, plated metal is used to form metal traces 218 on a dielectric layer. A plating process to create metal traces 218 may include patterning a photolithographic film or mask to form target connection paths in which the metal is to be plated, metal deposition that may include electroless deposition of an activation metal and electroless plating to form the metal traces 218 in a the patterned target connection paths, and removal of the photolithographic film or mask.

Figure 2E:

FIG. 2E shows another dielectric layer 220 of insulating material deposited over the one or more metal traces 218. In some embodiments, the insulating material used in dielectric layer 220 is different from the insulating material used in dielectric layer 214, which may have different mechanical, chemical, thermal, or optical properties. While dielectric layer 220 is shown as also being deposited over both the metal traces 218 and the remaining portions of the dielectric layer 214 (which may also be characterized as the dielectric layer 220 being deposited over the entirety of the flag 202), the dielectric layer 220 may instead be deposited only over and around the metal traces 218 in other embodiments to electrically isolate the traces 218. In still other embodiments, no top dielectric layer 220 may be needed, which would result in an exposed metal trace or metal pad layer (e.g., the resulting RDL structure shown in FIG. 2D).

In the embodiment shown in FIG. 2E, a top surface 222 of the dielectric layer 220 is planar, which may require additional dielectric material deposited around the trace 218, depending on the thickness of traces 218 and the technique used to apply the dielectric material. However, additional metal traces 218 (discussed below) may even be formed on non-planar surfaces, since the conductive ink can be successfully applied and sintered over varying contours of surface 222 (e.g., over bumps and valleys).

Figure 2F:
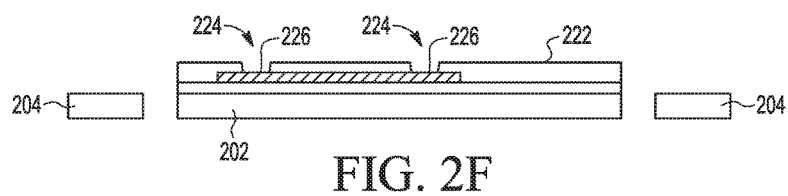

FIG. 2F shows a number of openings 224 patterned in the top surface 222 of the dielectric layer 220. The openings 224 expose a top surface 226 of the underlying metal trace 218, which forms a bonding surface 226 exposed in each opening 224. In the example shown, the metal trace 218 has two bonding surfaces 226, one on either end of the trace 218. Although not shown, additional coating(s) or layer(s) may be formed over the bonding surfaces 226 to promote enhanced wirebonding or soldering (e.g., improve attachment of a wirebond or a solder bump to the bonding surface 226). For example, a copper surface or pad may have one or more layers of titanium, aluminum, nickel, gold, and the like. In some embodiments, a wirebond connection may be formed between a bonding surface 226 and a bond pad of a die or other electronic component (e.g., shown in FIG. 7B). In other embodiments, a wirebond connection may be formed between a bonding surface 226 and a top surface of a lead 204 (e.g., shown in FIG. 7C). In still other embodiments, solder bumps of a flip chip die may be attached to rows of bonding surfaces 226 (e.g., shown in FIG. 9C). The metal traces 218 in the RDL structure in combination with various wirebond connections can be used to form a number of internal electrical connections between one or more electronic components, a number of external electrical connections between one or more electronic components and one or more leads 204, or both. Examples of electronic components include but are not limited to a wirebondable die, a flip chip die, a pressure sensor, and the like.

It is noted that other embodiments may not form the RDL structure only over the flag 202. For example, in other embodiments, dielectric layers and metal layers (like dielectric layers 214 and 220 and metal layer 218 in FIG. 2C-2E) may not be removed from the top surfaces 210 of the leads 204, where one or more additional RDL structures may also be formed over the leads 204 in a manner similar to that discussed above. Further, in still other embodiments, the dielectric layers and metal layers may not be removed from the spacing between the flag and the leads, where one large RDL structure may also be formed to extend across the spacing, or one or more additional RDL structures be formed across one or more spacings, in a manner similar to that discussed above. Such RDL structures provide additional routing options. Additionally, in some embodiments, the RDL structures (including dielectric and metal layers formed in a manner as described above) may be pre-fabricated on a temporary carrier and then attached to the top surface of the flag, top surface(s) of lead(s), or both.

FIG. 3A-3E show cross-sectional views that are representative of various steps of an alternative process for fabricating a redistributed layer (RDL) structure on a lead frame blank 300 that will be stamped or etched into a lead frame having a flag 302 and leads 304. It is noted that the lead frame blank 300 shown in FIG. 3A-3D may be an example single lead frame blank that is part of an array of lead frame blanks, where the process steps discussed herein are implemented on all lead frame blanks of the array. Similarly, the resulting lead frame in FIG. 3E may be an example single lead frame that is part of a resulting array of lead frames, or may representative of a single lead frame that is both formed and singulated from the resulting array of lead frames.

Figure 3A:
FIG. 3A-3E illustrate block diagrams depicting another example process for fabricating a redistributed layer (RDL) structure on a lead frame, according to some embodiments.

FIG. 3A shows lead frame blank 300 having a top surface 306 and a bottom surface 308. While the blank 300 is shown as having a uniform thickness (e.g., measured between top and bottom surfaces), it is noted that the blank 300 may have a different thickness in the area in which a flag 302 will be formed compared with the area in which leads 304 will be formed (as shown in FIG. 3E). For example, in an embodiment having one or more openings (for electrical components, as discussed below) or traces (also discussed below) etched into the resulting flag 302, the area of the blank 300 in which the flag 302 is located may be half-etched (e.g., may be etched to a thickness that is less than the original thickness of the blank 300, such as the area of the flag 302 is half as thick as the area of the leads 304) prior to formation of the RDL structure on the blank 300.

Figure 3B:

FIG. 3B shows a dielectric layer 314 deposited over (e.g., deposited directly on) the top surface 306 of the blank 300. Dielectric layer 314 is comparable to dielectric layer 214 as described above, including the techniques of deposition.

Figure 3C:
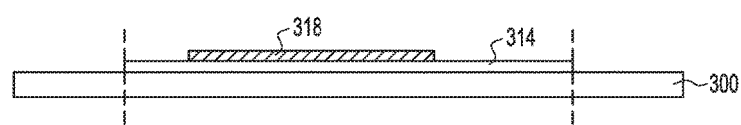

FIG. 3C shows a portion of the dielectric layer 314 remaining on the blank 300 in an area in which the flag 302 is located (as indicated by dashed vertical lines). Portions of the dielectric layer 314 are removed from areas of the blank 300 outside of the flag 302 area. Also, while the dielectric layer 314 is shown as covering the entirety of the flag 302 area between the dashed vertical lines, the dielectric layer 314 may be smaller than the flag 302 area in other embodiments. For example, the dielectric layer 314 may be patterned to remain in an area around an intended location of an electrical component (e.g., around a die, shown in FIGS. 10A and 11) or between the intended locations of two electrical components (e.g., between die, shown in FIG. 12A).

FIG. 3C also shows one or more metal traces 318 formed on the top of dielectric layer 314. The metal traces 318 may be formed using a similar process as the printing and sintering process (which may be achieved by a similar sintering system) described above in connection with FIGS. 2C and 2D. In embodiments where the traces 318 are left exposed (e.g., without any covering dielectric layer), the process may proceed directly to the stamp or etch operation discussed in connection with FIG. 3E.

Figure 3D:
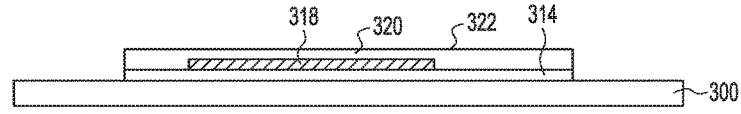
Figure 3E:
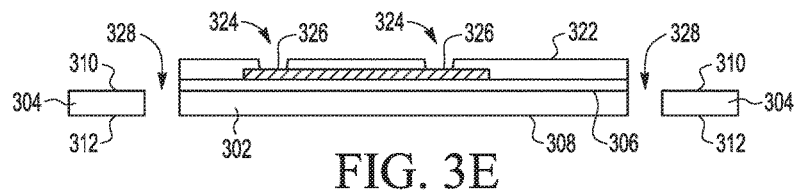

FIG. 3D shows another dielectric layer 320 deposited over the one or more metal traces 318. Dielectric layer 320 may be deposited over the entirety of the flag 302 area or may be deposited over and around traces 318, as discussed above. Dielectric layer 320 is comparable to dielectric layer 220 as described above, including techniques of deposition.

FIG. 3E shows a number of openings 324 patterned in the top surface 322 of the dielectric layer 320. The openings 324 expose a top surface 326 of the underlying metal trace 318, which forms a bonding surface 326 exposed in each opening 324. Bonding surfaces 326 are comparable to bonding surfaces 226 as described above.

FIG. 3E also shows blank 300 being stamped or etched into a lead frame having a flag 302 and a number of leads 304. The stamp or etch operation creates an opening or separation 328 between the flag 302 area of the blank and the lead 304 areas of the blank, where the resulting flag 302 and leads 304 are laterally separated from one another. While the flag 302 and leads 304 in FIG. 3E are shown as being co-planar, the flag 302 and leads 304 may be at different elevations in other embodiments. For example, the flag 302 may be down-set or up-set from the leads 304 by some vertical distance.

It is noted that the processes shown in FIG. 2A-2F and FIG. 3A-3E may also include forming openings through the flag and through the RDL structure, such as for a pressure sensor as shown in FIG. 7A, discussed below. It is also noted that the fabrication of the RDL structure shown in FIG. 2A-2F and FIG. 3A-3E is performed directly on the flag, on one or more leads, or both (e.g., dielectric and metal layers are deposited directly onto the flag, the leads, or both), without requiring any adhesive layers to attach the RDL structure to either the flag or the leads. In other embodiments, the RDL structure may be fabricated on a temporary carrier, removed from the temporary carrier, and attached to the lead frame, such as to the flag, to one or more leads, or both. In such embodiments, the RDL structure may be attached to the lead frame either as part of the lead frame fabrication process or package assembly.

Figure 4:
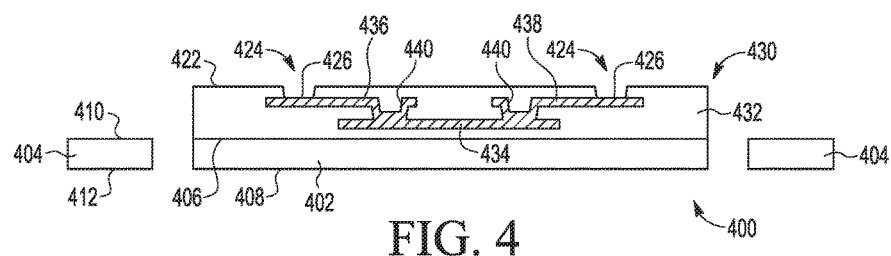
FIGS. 4, 5, and 6 illustrate block diagrams depicting various example connection paths implemented in an RDL structure on a lead frame, according to some embodiments.
Figure 5:
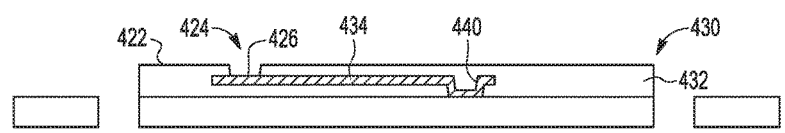
Figure 6:
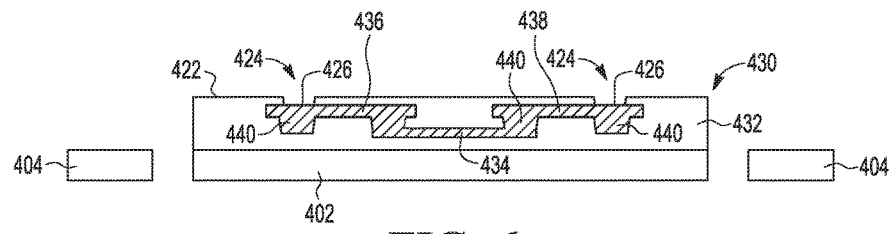

While FIG. 2F and FIG. 3E show single layer metal traces of an RDL structure, additional metal traces can be printed and sintered and additional dielectric layers can be deposited and patterned (such as by repeating the printing, sintering, deposition, and patterning steps discussed in connection with FIGS. 2C, 2D, 2E, and 2F, or FIGS. 3C, 3D, and 3E) to create complex routing paths through the RDL structure, examples of which are shown in FIGS. 4, 5, and 6.

FIG. 4 shows a cross-sectional view of an example multi-level connection path through an RDL structure 430 formed on a top surface 406 of flag 402 of a lead frame 400. The lead frame 400 and RDL structure 430 may be created by a suitable process, such as the processes discussed above in connection with FIG. 2A-2F and FIG. 3A-3E.

RDL structure 430 includes a single layer metal trace 434 (similar to metal trace 218 shown in FIG. 2F) having two portions of its top surface exposed within vias 440, which are openings through an intermediate layer of the surrounding dielectric material 432. It is noted that the RDL structure 430 includes a number of intermediate layers of dielectric material 432, as discussed above in connection with FIG. 2E.

RDL structure 430 also includes another single layer metal trace 436 that includes metal formed over and within the left-most via 440 of FIG. 4, forming a metal-lined via 440 in contact with the exposed surface of the underlying metal trace 434. The metal-lined via 440 (and other metal-lined vias 440 discussed herein) may be formed during a same conductive ink printing and sintering process that forms metal trace 436 (or other corresponding metal trace discussed herein), where conductive ink is applied on a top surface of the intermediate layer of dielectric material 432 and into the opening of the intermediate layer in which the top surface of underlying trace 434 is exposed, and then sintered to form metal trace 436 and metal-lined via 440 that is fused to the exposed top surface of the underlying trace 434. Metal trace 436 also includes a bonding surface 426 exposed in an opening 424 through the top surface 422 of RDL structure 430.

Another single layer metal trace 438 is also shown, having a metal-lined via 440 formed over and in contact with an exposed surface of the underlying metal trace 434 (e.g., the right-most via 440 of FIG. 4). Metal trace 438 also includes a bonding surface 426 exposed in an opening 424 through the top surface 422 of RDL structure 430. In this manner, multiple routing paths may be formed at various levels within the RDL structure 430, which allows for more complex or dense routing to be formed through the RDL structure 430.

FIG. 5 shows a cross-sectional view of an example ground connection path made to the flag 402 in an RDL structure 430 formed on the top surface 406 of the flag 402 of a lead frame 400. As noted above, RDL structure 430 includes a number of intermediate layers of dielectric material 432, which includes a first layer of dielectric material 432 formed directly on the top surface 406 of the flag 402. A via 440 is opened in the first layer of dielectric material 432 to expose a portion of the top surface of the flag 402. A single layer metal trace 434 is then formed on the first layer of dielectric material 432 (similar to metal trace 218 shown in FIG. 2F), which includes forming a metal layer over and within the via 440, which results in a metal-lined via 440 in contact with the exposed surface of the flag 402. Metal trace 434 also has a bonding surface 426 exposed in an opening 424 through the top surface 422 of the RDL structure 430. A wirebond connection can also be formed between the bonding surface 426 and a top surface 410 of the ground lead 404, where a bottom surface 412 of the ground lead 404 of a resulting packaged semiconductor device may in turn be connected to a ground signal pad of a printed circuit board (PCB).

FIG. 6 shows a cross-sectional view of an example multi-level connection path through an RDL structure 430 formed on a top surface 406 of the flag 402 of a lead frame 400. The RDL structure 430 of FIG. 6 is similar to that shown in FIG. 4, with the exception of the structure and location of metal-filled vias 440. Metal-filled vias 440 may be formed by a conductive ink printing and sintering process that is separate from the process to form metal traces 436 and 438. For example, a number of vias 440 or openings are formed in an intermediate layer of dielectric material 432 by printing and sintering multiple metal layers within each opening, forming a metal-filled via 440 having a top surface that is co-planar with a top surface of the intermediate layer. Then a metal trace (like traces 436 and 438) are formed over the top surface of the intermediate dielectric layer and over the top surface of the metal-filled via 440. The metal-filled vias 440 within routing connection paths (such as the two vias 440 closest to the center of FIG. 6) may beneficially provide additional strength to the RDL structure 430 to prevent damage to the routing connection paths through the RDL structure 430 when an electronic component (such as a die) is attached to the top surface 422 of the RDL structure 430. Further, metal-filled vias 440 are additionally located under bonding surfaces 426 of metal traces 436 and 438 to reinforce the bonding surfaces 426 and aid in proper wire bonding (e.g., a metal-filled via 440 is thicker than a single layer trace, where the thicker metal-filled via can withstand any normal deformation that may occur during wire bonding).

As described above, the RDL structure includes connection paths for routing from electronic components to leads (e.g., providing external connections), for routing between electronic components (e.g., providing internal connections), or both. Various types of electronic components may be included in a packaged semiconductor device that includes an RDL structure, where such electronic components may be mounted to the flag, to the RDL structure itself, or both. Various examples of packaged semiconductor devices that implement the present disclosure are shown in FIGS. 7A-7C, 8A-8C, 9A-9C, 10A-10C, 11, and 12, which may include additional electronic components not shown. Additionally, while the lead frame shown in these figures is a QFN lead frame, the present disclosure is applicable to other types of lead frames and chip carriers used in packaged semiconductor devices, such as those listed above in connection with FIG. 1.

FIG. 7A shows a top-down view, and FIGS. 7B and 7C show cross-sectional views, of an example packaged semiconductor device built on a lead frame before being overmolded. As shown in FIG. 7A, an RDL structure 430 is formed on a top surface of flag 402, with a number of leads 404 arranged laterally around the flag 402. A wirebondable die 450 is mounted to the RDL structure 430 in a face-up orientation. The wirebondable die 450 is representative of other electronic components that may be similarly attached to the RDL structure 430 in a face-up orientation. The RDL structure 430 includes several connection paths, as represented by connection paths 734 and 736. The connection paths may be formed by one or more metal layers or traces, as described above. Each connection path has at least one bonding surface 426 exposed in the top layer of RDL structure 430. In the example shown, connection paths 734 and 736 each include a pair of bonding surfaces 426, one at either end of the path.

As shown in FIG. 7B, the die 750 has several bond pads 752 on an active side 754 that is facing up, where a representative pair of bond pads 752 are shown in the figures. A back side 756 of the die 750 is attached to the top surface 422 of the RDL structure 430, such as by die attach material. A wirebond connection 740 is formed between a respective bond pad 752 of the die 450 and a respective bonding surface 426 of connection path 734. While bonding surface 426 is shown as being exposed in the top surface of the RDL structure 430 (e.g., exposed through a layer of dielectric material 432), the bonding surface 426 may simply be an exposed metal trace or pad formed on the top surface of the RDL structure 430 (e.g., uncovered by any dielectric material 432) in other embodiments.

As shown in FIG. 7C, another wirebond connection 742 is formed between a respective bonding surface 426 of connection path 736 and a respective lead 404. As shown in FIG. 7A, connection path 736 is also electrically connected to a respective bond pad 752 of die 750 via a respective wirebond connection 740. In this manner, connection path 736 in combination with wirebond connections 740 and 742 form a signal routing path from the die 750 to the lead 404 through the RDL structure 430. The connection paths of the RDL structure 430 (such as paths 736 and 734) are routed in such a way that allows the die 450 (or other electrical component) to be electrically connected to various leads 404 without requiring the die 750 to be placed nearest those leads 404 or requiring that the die be oriented (e.g., rotated) in such a way to present the die pads nearer to the leads. The connection paths of the RDL structure 430 also allow routing around and beneath other electrical components that may be included in the packaged semiconductor device, providing flexibility to the layout of electronic components in the packaged semiconductor device (such as on the RDL structure 430 or on the flag 402 itself, as further discussed below).

FIGS. 7A and 7C also show a pressure sensor outline 760, which is located over an opening 762 through the RDL structure 430 that is aligned with an opening 764 through the flag 402. The pressure sensor 760 is attached to the top surface of the RDL structure 430 within the dashed outline, allowing air from the ambient environment to reach the pressure sensor 760 through the vent created by openings 762 and 764. The pressure sensor 760 is representative of other sensors that may be included in the packaged semiconductor device that require a vent or other opening to the ambient environment.

It is noted that the RDL structure 430 may also be suitable for film assisted molding (FAM), where a mold cavity may be located above one or more of the electronic components of the packaged semiconductor device to provide access to the one or more electronic components. The RDL structure 430 ensures interconnection between the electronic components of the packaged semiconductor device while also providing layout flexibility for wirebond connections. In other words, wirebond connections can be "shifted" on the component layout on the flag 402 (such as to be closer to leads 404 or farther away from the mold cavity), which prevents having wirebond connections transitioning between mold compound and the cavity space.

Figure 8B:
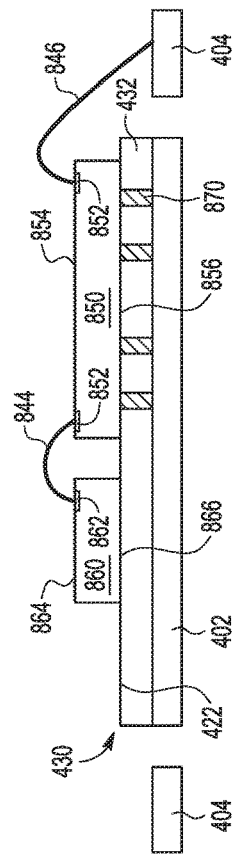
Figure 8C:
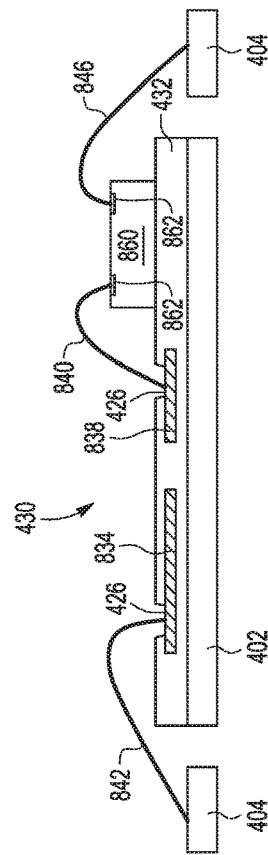
Figure 8A:
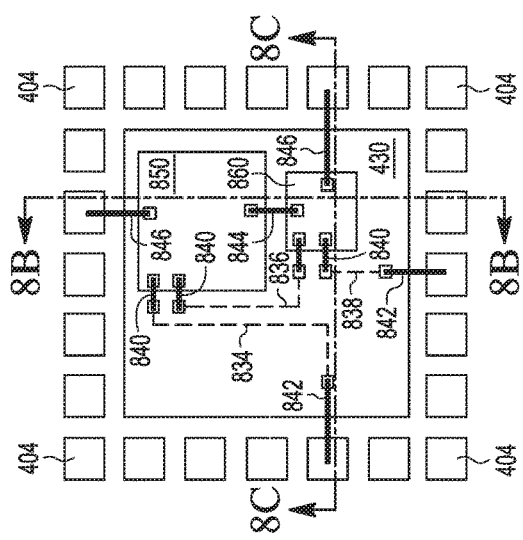

FIG. 8A shows a top-down view, and FIGS. 8B and 8C show cross-sectional views, of another example packaged semiconductor device built on a lead frame before being overmolded. As shown in FIG. 8A, two wirebondable die 850 and 860 are mounted to the RDL structure 430 in a face-up orientation, where respective back sides 856 and 866 of die 850 and 860 are attached to the top surface 422 of RDL structure 430, as further shown in FIG. 8B. RDL structure includes various connection paths, which are represented by connection paths 834, 836, and 838. Wirebondable die 850 has a number of bond pads 852, which can be connected to various leads 404 by a respective signal routing path that includes a wirebond connection 840 between the bond pad 852 and a bonding surface 426 of connection path 834, where the connection path 834 extends through the RDL structure 430, and a wirebond connection 842 between another bonding surface 426 of the connection path 834 and a lead 404. Similarly, wirebondable die 860 has a number of bond pads 862, which can be connected to various leads 404 by a respective signal routing path that includes a wirebond connection 840 between the bond pad 862 and a bonding surface 426 of a connection path 838, which extends through the RDL structure 430, and a wirebond connection 842 between another bonding surface 426 of connection path 838 and another lead 404.

Additionally, signal routing paths can be formed to electrically connect the die 850 and 860. As shown in FIG. 8A, such a signal routing path includes a wirebond connection 840 formed between a bond pad 852 on an active side 854 of die 850 and a bonding surface 426 of connection path 836, which extends through the RDL structure, and another wirebond connection 840 between another bonding surface 426 of connection path 836 and a bond pad 862 on an active side 864 of die 860.

Other types of connections may also be formed in the packaged semiconductor device. For example, as shown in FIG. 8B, a wirebond connection 844 may be formed directly between a respective bond pad 852 of die 850 and a respective bond pad 862 of die 860. As also shown in FIG. 8B, a wirebond connection 846 may be formed between a respective bond pad 852 of die 850 and a respective lead 404. Similarly, as shown in FIG. 8C, a wirebond connection 846 may be formed between a respective bond pad 862 of die 860 and a respective lead 404.

It is also noted that in the embodiment shown, die 850 is mounted on top of the RDL structure 430, which may hinder thermal conductivity between the die and the flag 402. To mitigate this effect, FIG. 8B shows several metal filled vias 870 in the RDL structure 430 under the die 850 that extend from the back side 856 of the die 850 to the top surface of the flag 402. The metal filled vias 870 (such as copper filled vias) are in thermal contact with the back side 856 of the die 850 and with the top surface of the flag 402 and provide several thermal paths from the die 850 to the flag 402. Vias 870 are formed in various sizes and shapes and placed at locations within the RDL structure 430 under the die such that they do not interfere with other features of the RDL structure (e.g., traces or pads, as further discussed below).

FIG. 9A shows a top-down view, and FIGS. 9B and 9C show cross-sectional views, of an example packaged semiconductor device built on a lead frame before being overmolded. As shown in FIG. 9A, a flip chip die 960 is mounted to the RDL structure 430 in a face-down orientation, where solder bumps 962 on an active side 964 of the flip chip die 960 are attached to bonding surfaces 426 in FIGS. 9B and 9C (where a representative row of bonding surfaces 426 underneath flip chip die 960, also referred to as RDL pads 948, are also shown as boxes with dashed outlines in FIG. 9A). The flip chip die 960 is representative of other electronic components that may be similarly mounted to the RDL structure 430 in a face-down orientation. While a wirebondable die 950 is mounted to the back side of flip chip die 960 in the example shown in FIGS. 9A and 9B, the flip chip die 960 need not have any other die or electronic component mounted to its back side in other embodiments.

RDL structure 430 includes several connection paths, as represented by paths 934, 936, and 938, which provide signal routing paths for the flip chip die 960 and wirebondable die 950. Internal connections between die 960 and die 950 may be provided by signal routing paths formed through the RDL structure 430. For example, as shown in FIGS. 9A and 9B, such an internal signal routing path includes a respective solder bump 962 of the flip chip die 960 that is electrically connected (e.g., by reflow) to a respective RDL pad 948 (or exposed bonding surface 426) of connection path 936, where path 936 extends through the RDL structure 430, and a wirebond connection 940 between another bonding surface 426 of connection path 936 and a bond pad 952 of the wirebondable die 950. Wirebond connection 940 (between a die and a bondable surface in the RDL structure) is similar to wirebond connection 740 of FIG. 7B and wirebond connection 840 of FIG. 8B.

External connections between flip chip die 960 and leads 404 may also be provided by signal routing paths formed through the RDL structure 430. For example, as shown in FIGS. 9A and 9B, such an external signal routing path includes a respective solder bump 962 of the flip chip die 960 that is electrically connected (e.g., by reflow) to a respective RDL pad 948 (or bonding surface 426) of connection path 934, where path 934 extends through the RDL structure 430, and a wirebond connection 942 between another bonding surface 426 of connection path 934 and a respective lead 404. Wirebond connection 942 (between a bondable surface in the RDL structure and a lead) is similar to wirebond connection 742 of FIG. 7C and wirebond connection 842 of FIG. 8C.

Similarly, external connections between wirebondable die 950 and leads 404 may be provided by signal routing paths formed through the RDL structure 430. For example, such an external signal routing path includes a wirebond connection 940 formed between a bond pad 952 of wirebondable die 950 and a bondable surface of connection path 938, which extends through the RDL structure 430, and a wirebond connection 942 between another bonding surface 426 of connection path 938 and a respective lead 404.

Other types of connections may also be formed in the packaged semiconductor device, as also described above. For example, a wirebond connection 946 may be formed directly on a bond pad 952 of die 950 and on a respective lead 404, as shown in FIG. 9B.

FIG. 10A shows a top-down view, and FIGS. 10B and 10C show cross-sectional views, of an example packaged semiconductor device built on a lead frame before being overmolded. As shown in FIGS. 10A and 10B, wirebondable die 1050 has a back side 1056 that is directly attached to the top surface of the flag 402, such as with die attach material. The RDL structure 430 is formed on the flag 402 around the area in which wirebondable die 1050 is attached. Bond pads 1052 of the die 1050 may be electrically connected to leads 404 via direct wirebond connections 1046 (shown in FIG. 10B), or through connection paths like paths 1034 and 1036 and wirebond connections 1040 (shown in FIG. 10C) and 1042 (shown in FIG. 10B).

Figure 11A:
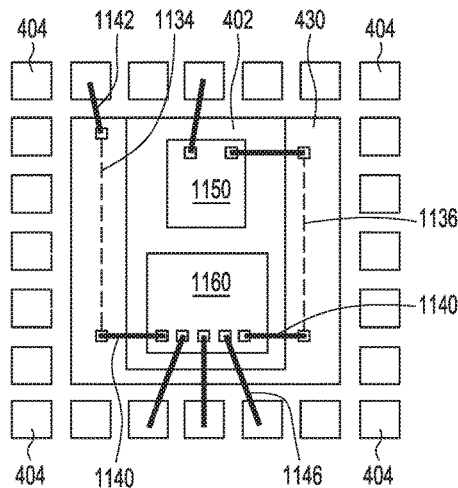

FIG. 11A shows a top-down view of an example packaged semiconductor device built on a lead frame before being overmolded. In the example shown, wirebondable die 1150 and 1160 are both attached directly to the top surface of the flag 402, with the RDL structure 430 surrounding both die. Die 1150 and 1160 may be electrically connected to one another by a number of internal connections represented by path 1136 and wirebond connections 1140 and 1142, and electrically connected to leads 404 by a number of external connections represented by path 1134 and direct wirebond connections 1146.

Figure 11B:
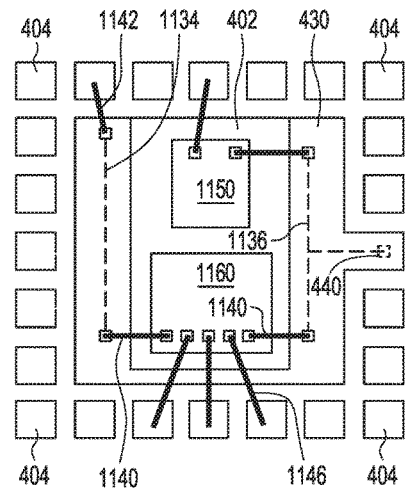

FIG. 11B shows a top-down view of an example packaged semiconductor device like that shown in FIG. 11A, with the addition of an extended portion of RDL structure 430 formed across the spacing and on top of a lead 404 (e.g., the middle lead 404 on the right vertical row of leads 404). The trace 1136 that connects die 1150 and 1160 also extends over the spacing to lead 404. A metal-lined or metal-filled via 440 (shown in dashed outline) then drops down from the trace 1136 to make electrical contact with the top surface of the lead 404. Additional external connections between the die and the leads can be made in this manner, which avoids the use of wirebond connections.

Figure 12A:
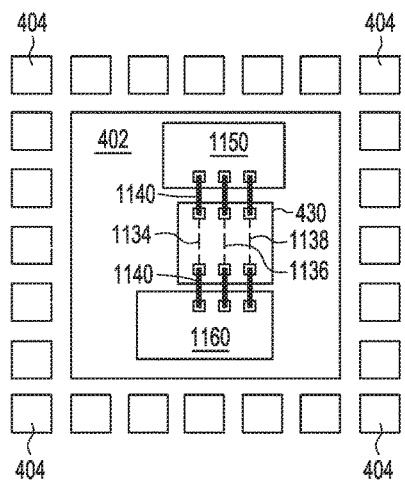

FIG. 12A shows a top-down view of an example packaged semiconductor device built on a lead frame before being overmolded. In the example shown, wirebondable die 1150 and 1160 are both attached directly to the top surface of the flag 402, with the RDL structure 430 located between the die. Die 1150 and 1160 may be electrically connected to one another by a number of internal connections represented by paths 1134, 1136, and 1138 and wirebond connections 1140, as well as electrically connected to leads 404, as described above.

Figure 12B:
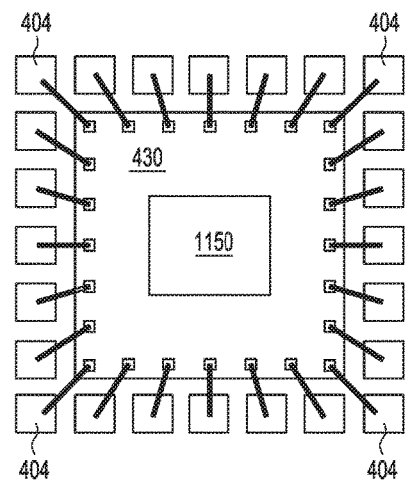

FIG. 12B shows a top-down view of an example packaged semiconductor device built on a lead frame before being overmolded. In the example shown, wirebondable die 1150 is attached to the top surface of the flag 402 in a face-down (active-side-down) orientation. The bond pads of the die 1150 are attached to respective bondable surfaces of the RDL structure 430 underneath the die 1150 by solder bumps or balls, in a flip-chip like manner discussed above in connection with FIG. 9A-9C. The connection paths are routed from the bond pads of the die 1150 to bondable surfaces near the perimeter of the RDL structure 430, which is close to the edge of the underlying flag 402. Wirebond connections can then be made between the bondable surfaces and the leads 404. Additional electronic components or die may also be included in such an embodiment, where the electronic components or die are communicatively coupled through the RDL structure in a manner like that discussed above.

Figure 13A:
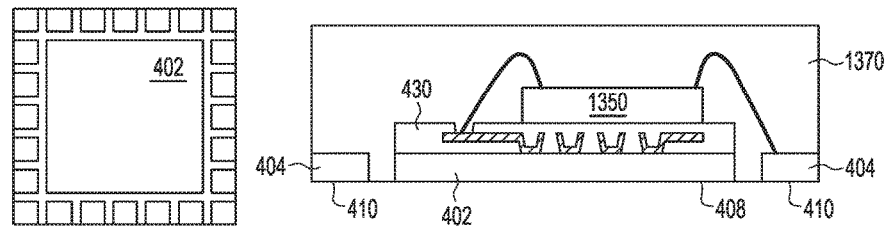
FIGS. 13A-13D and 14A-14E illustrate block diagrams depicting an example process for implementing additional components on a bottom side of a packaged semiconductor device, according to some embodiments.

FIG. 13A-13D show bottom-up views (on the left) and corresponding cross-sectional views (on the right) that are representative of various steps of a process for creating a double-sided packaged semiconductor device. FIG. 13A shows an RDL structure 430 and a die 1350 (which are representative of any combination of electronic components and differently-shaped RDL structures 430 as discussed above) built on a lead frame that has been overmolded with mold compound 1370, where bottom surface 408 of flag 402 and bottom surfaces 410 of leads 404 are exposed through the mold compound 1370. The mold compound may be based on a biphenyl type or multi-aromatic type epoxy resin, but may be other types of materials in other embodiments. The overmolding may be performed by transfer molding, underfill, glob top, or other types of encapsulation.

Figure 13B:
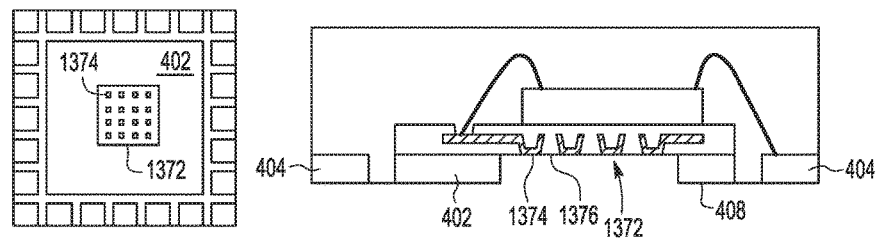

FIG. 13B shows an opening 1372 etched into the bottom surface 408 of the flag 402, which removes a portion of the flag 402 to expose a bottom surface of the RDL structure 430. The bottom surface of the RDL structure 430 includes exposed surfaces 1376 of the dielectric material of the RDL structure 430 and exposed surfaces 1374 of metal connection paths in the RDL structure 430. The exposed metal surfaces 1374 are formed in the RDL structure 430 in a pattern for an electronic component that will be attached within the opening 1372. As shown in the bottom-up view on the left, metal surfaces 1374 are arranged for flip chip attachment.

Figure 13C:
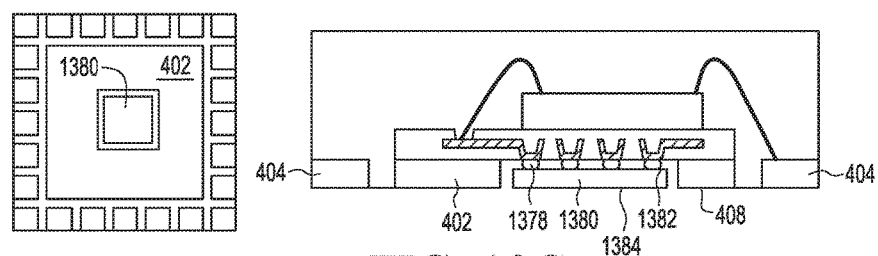

FIG. 13C shows a flip chip die 1380 having a number of solder bumps 1378 on an active side 1382 connected to respective metal surfaces 1374. While the back side 1384 of the flip chip die 1380 is shown to be (substantially) co-planar with the bottom surface 408 of the flag, the back side 1384 of the flip chip die 1380 (or other electronic component placed within the opening 1372) need not be co-planar in other embodiments.

Figure 13D:
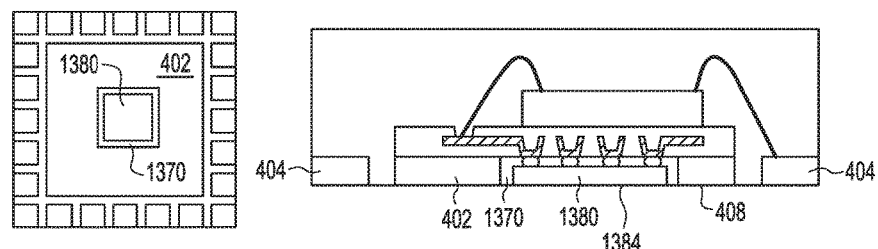

FIG. 13D shows additional mold compound 1370 around the flip chip die 1380. In some embodiments, the mold compound 1370 may also be present between the flip chip die 1380 and the exposed surface of the RDL structure 430, such as around solder bumps 1378. However, in other embodiments, mold compound 1370 may not be present between the flip chip die 1380 and the exposed surface of the RDL structure 430. Further, in some embodiments, mold compound 1370 may not be present in the opening 1372 around the flip chip die 1380, resulting in a package like that shown in FIG. 13C. In still other embodiments, the mold compound 1370 may be present over the back side 1384 of the flip chip 1380. The molding may be performed by transfer molding, underfill, glob top, or other types of encapsulation.

Figure 14A:
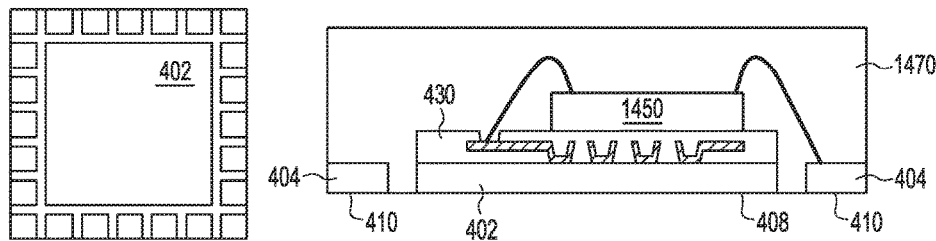
Figure 14B:
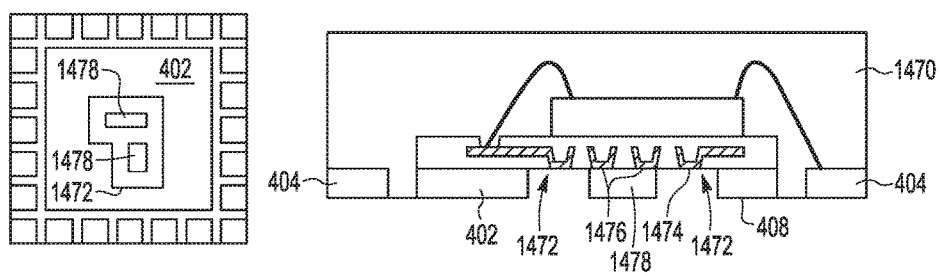
Figure 14C:
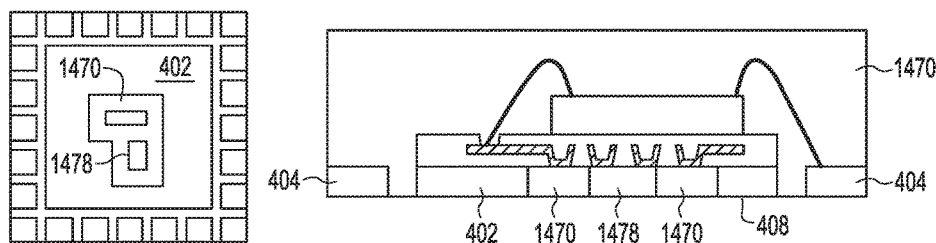

FIG. 14A-14C show bottom-up views (on the left) and corresponding cross-sectional views (on the right) that are representative of various steps of a process for creating a double-sided packaged semiconductor device. Similar to FIG. 13A, FIG. 14A shows an RDL structure 430 and a die 1450 (which are representative of any combination of electronic components and differently-shaped RDL structures 430 as discussed above) built on a lead frame that has been overmolded with mold compound 1470, where bottom surface 408 of flag 402 and bottom surfaces 410 of leads 404 are exposed through the mold compound 1370.

FIG. 14B shows an opening 1472 etched into the bottom surface 408 of the flag 408 which removes a portion of the flag 402 and exposes portions of a bottom surface of the RDL structure 430. The opening 1472 is shaped such that one or more portions of the flag 402 remain over bottom metal surfaces 1476 of the RDL structure 430, forming a trace 1478 that electrically connects the metal surfaces 1476 in contact with the trace 1478. Other bottom metal surfaces 1474 may also be exposed within the opening 1472, where electronic components may be attached thereto in a manner similar to that shown above in FIG. 13C.

Figure 14D:
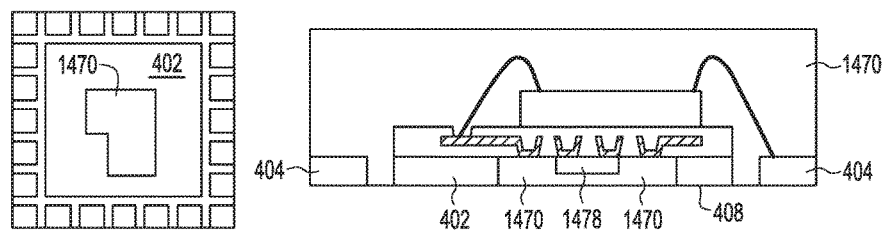

FIG. 14C shows additional mold compound 1470 filled in the opening 1472 and around traces 1478. In other embodiments, traces 1478 may be half-etched during the etching step shown in FIG. 14B, where the traces 1478 are "recessed" from the bottom surface 408 of the flag 402, which is shown in FIG. 14D. In such embodiments, the mold compound 1470 also covers the traces 1478 for insulation and protection, while maintaining a bottom surface of the mold compound 1470 that is co-planar with the bottom surface 408 of the flag 402. Additionally, if any electronic components are mounted within the opening 1472, mold compound 1470 would similarly surround those electronic components. The molding may be performed by transfer molding, underfill, glob top, or other types of encapsulation.

Figure 14E:
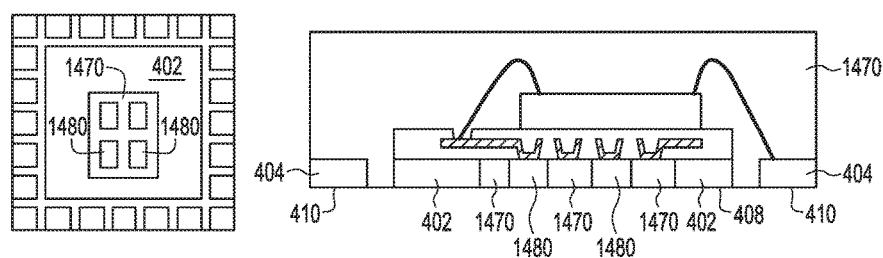

FIG. 14E shows another arrangement of remaining portions of the flag 402 after an etching step like that discussed above in FIG. 14B and additional mold compound 1470 has been filled in around the remaining portions of the flag 402. In such embodiments, the remaining portions of the flag 402 form additional external connections or pads 1480 in the center of the package that may be directly connected to the PCB in a manner like the leads 404 around the perimeter of the package. In other words, the bottom surfaces of the pads 1480 may be connected to the PCB by solder bumps or balls in a manner similar to the bottom surface 410 of the leads 404 that are connected to the PCB. The pads 1480 are connected to pads of the die, and may provide a shorter signal routing path to the PCB as compared with the signal routing paths that are routed on the flag and then pass through the leads 404, which in turn provides faster signal reception at the PCB.

By now it should be appreciated that there has been provided a lead frame and solution of an redistribution layer (RDL) structure formed on a flag of the lead frame that includes a plurality of dielectric and metal layers that form a number of metal connection paths through the RDL structure to provide routing on the flag for a die or an electronic component to the leads of the lead frame.

In one embodiment of the present disclosure, a packaged semiconductor device is provided, which includes: a flag of a lead frame having a top surface and a bottom surface; a redistribution layer (RDL) structure formed on the top surface of the flag, the RDL structure including a first connection path having a first exposed bonding surface in a top surface of the RDL structure; and a first wirebond connected to the first exposed bonding surface and to a lead of the lead frame.

One aspect of the above embodiment provides that the packaged semiconductor device further includes: a first die having a first bond pad on a front side of the first die; and a second wirebond connected to the first bond pad of the first die and to a second exposed bonding surface of the first connection path.

A further aspect of the above embodiment provides that the first die has a back side directly attached to the top surface of the RDL structure.

Another further aspect of the above embodiment provides that the first die has a back side directly attached to the top surface of the flag.

Another further aspect of the above embodiment provides that the packaged semiconductor device further includes: a second die having a second bond pad on a front side of the second die, and a third wirebond connected to the second bond pad and a third exposed bonding surface of the RDL structure.

A still further aspect of the above embodiment provides that the third exposed bonding surface is part of a second connection path of the RDL structure, the second connection path has a fourth exposed bonding surface, a fourth wirebond is connected to the fourth exposed bonding surface and to another bond pad of the first die, and the second connection path provides an electrical connection between the first die and the second die.

Another still further aspect of the above embodiment provides that the third exposed bonding surface is part of a second connection path of the RDL structure, the second connection path has a fourth exposed bonding surface, and a fourth wirebond is connected to the fourth exposed bonding surface and to another lead of the lead frame.

Another still further aspect of the above embodiment provides that the second die has a back side directly attached to the top surface of the flag.

Another still further aspect of the above embodiment provides that the second die has a back side directly attached to the top surface of the RDL structure.

Another aspect of the above embodiment provides that the packaged semiconductor device further includes: a flip chip die having a plurality of solder bumps on a front side of the flip chip die, wherein the RDL structure further includes a plurality of connection paths, each connection path having at least one exposed bonding surface in a top surface of the RDL structure, and each of the plurality of solder bumps are connected to a respective exposed bonding surface of the RDL structure.

A further aspect of the above embodiment provides that the first connection path of the RDL structure has a second exposed bonding surface connected to one of the plurality of solder bumps, and the first connection path provides an electrical connection between the flip chip die and the lead.

Another further aspect of the above embodiment provides that the packaged semiconductor device further includes: a wirebondable die having a bond pad on a front side of the wirebondable die, wherein the wirebondable die has a back side directly attached to a back side of the flip chip die.

A still further aspect of the above embodiment provides that the packaged semiconductor device further includes: a second wirebond connected to the bond pad of the wirebondable die and to a second exposed bonding surface of the RDL structure.

Another still further aspect of the above embodiment provides that the second exposed bonding surface is part of the first connection path of the RDL structure, and the first connection path provides an electrical connection between the wirebondable die and the lead.

Another still further aspect of the above embodiment provides that the second exposed bonding surface is part of a second connection path of the RDL structure, the second connection path has a third exposed bonding surface connected to one of the plurality of solder bumps, and the second connection path provides an electrical connection between the flip chip die and the wirebondable die.

In another embodiment of the present disclosure, a packaged semiconductor device is provided, which includes: a flag of a lead frame having a top surface and a bottom surface; a redistribution layer (RDL) structure formed on the top surface of the flag, the RDL structure including a plurality of connection paths; an opening through the bottom surface of the flag to a bottom surface of the RDL structure, wherein one or more bonding surfaces of the plurality of connection paths are exposed in the bottom surface of the RDL structure within the opening; and an electronic component having a plurality of solder bumps, wherein each of the plurality of solder bumps are connected to a respective bonding surface of the RDL structure exposed within the opening.

One aspect of the above embodiment provides that the packaged semiconductor device further includes: a wirebondable die having a bond pad; and a wirebond connected to the bond pad of the wirebondable die and to a first exposed bonding surface in a top surface of the RDL structure, wherein the first exposed bonding surface is part of a first connection path.

A further aspect of the above embodiment provides that the first connection path has a second exposed bonding surface in the bottom surface of the RDL structure connected to one of the plurality of solder bumps, and the first connection path provides an electrical connection between the wirebondable die and the electronic component.

Another aspect of the above embodiment provides that the electronic component includes a flip chip die.

Another aspect of the above embodiment provides that the packaged semiconductor device further includes: a flip chip die having a second plurality of solder bumps, wherein the plurality of connection paths further have bonding surfaces exposed in a top surface of the RDL structure, and each of the second plurality of solder bumps are connected to a respective bonding surface in the top surface of the RDL structure, wherein the plurality of connection paths provide electrical connections between the flip chip die and the electronic component.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to achieve the stated purpose or value in a practical manner, taking into account any minor imperfections or deviations, if any, that arise from usual and expected process abnormalities that may occur during device fabrication and packaging, which are not significant for the stated purpose or value. Also as used herein, the term space or cavity indicates a void or volume in which material is absent.

Although the invention is described herein with reference to specific embodiments, various modifications and changes can be made without departing from the scope of the present invention as set forth in the claims below. For example, additional or fewer conductive paths in the RDL structure may be implemented in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
   a flag of a lead frame having a top surface and a bottom surface;
   a redistribution layer (RDL) structure formed on the top surface of the flag, the RDL structure comprising a first connection path having a first exposed bonding surface in a top surface of the RDL structure; and
   a first wirebond connected to the first exposed bonding surface and to a lead of the lead frame.

2. The packaged semiconductor device of claim 1, further comprising:
   a first die having a first bond pad on a front side of the first die; and
   a second wirebond connected to the first bond pad of the first die and to a second exposed bonding surface of the first connection path.

3. The packaged semiconductor device of claim 2, wherein
   the first die has a back side directly attached to the top surface of the RDL structure.

4. The packaged semiconductor device of claim 2, wherein
   the first die has a back side directly attached to the top surface of the flag.

5. The packaged semiconductor device of claim 2, further comprising:
   a second die having a second bond pad on a front side of the second die, and
   a third wirebond connected to the second bond pad and a third exposed bonding surface of the RDL structure.

6. The packaged semiconductor device of claim 5, wherein
   the third exposed bonding surface is part of a second connection path of the RDL structure,
   the second connection path has a fourth exposed bonding surface,
   a fourth wirebond is connected to the fourth exposed bonding surface and to another bond pad of the first die, and
   the second connection path provides an electrical connection between the first die and the second die.

7. The packaged semiconductor device of claim 5, wherein
   the third exposed bonding surface is part of a second connection path of the RDL structure,
   the second connection path has a fourth exposed bonding surface, and
   a fourth wirebond is connected to the fourth exposed bonding surface and to another lead of the lead frame.

8. The packaged semiconductor device of claim 5, wherein
   the second die has a back side directly attached to the top surface of the flag.

9. The packaged semiconductor device of claim 5, wherein
   the second die has a back side directly attached to the top surface of the RDL structure.

10. The packaged semiconductor device of claim 1, further comprising:
    a flip chip die having a plurality of solder bumps on a front side of the flip chip die, wherein
       the RDL structure further comprises a plurality of connection paths, each connection path having at least one exposed bonding surface in a top surface of the RDL structure, and
       each of the plurality of solder bumps are connected to a respective exposed bonding surface of the RDL structure.

11. The packaged semiconductor device of claim 10, wherein
    the first connection path of the RDL structure has a second exposed bonding surface connected to one of the plurality of solder bumps, and
    the first connection path provides an electrical connection between the flip chip die and the lead.

12. The packaged semiconductor device of claim 10, further comprising:
a wirebondable die having a bond pad on a front side of the wirebondable die, wherein the wirebondable die has a back side directly attached to a back side of the flip chip die.

13. The packaged semiconductor device of claim 12, further comprising:
a second wirebond connected to the bond pad of the wirebondable die and to a second exposed bonding surface of the RDL structure.

14. The packaged semiconductor device of claim 13, wherein
the second exposed bonding surface is part of the first connection path of the RDL structure, and
the first connection path provides an electrical connection between the wirebondable die and the lead.

15. The packaged semiconductor device of claim 13, wherein
the second exposed bonding surface is part of a second connection path of the RDL structure,
the second connection path has a third exposed bonding surface connected to one of the plurality of solder bumps, and
the second connection path provides an electrical connection between the flip chip die and the wirebondable die.

16. A packaged semiconductor device comprising:
a flag of a lead frame having a top surface and a bottom surface;
a redistribution layer (RDL) structure formed on the top surface of the flag, the RDL structure comprising a plurality of connection paths;
an opening through the bottom surface of the flag to a bottom surface of the RDL structure, wherein one or more bonding surfaces of the plurality of connection paths are exposed in the bottom surface of the RDL structure within the opening; and
an electronic component having a plurality of solder bumps, wherein each of the plurality of solder bumps are connected to a respective bonding surface of the RDL structure exposed within the opening.

17. The packaged semiconductor device of claim 16, further comprising:
a wirebondable die having a bond pad; and
a wirebond connected to the bond pad of the wirebondable die and to a first exposed bonding surface in a top surface of the RDL structure, wherein the first exposed bonding surface is part of a first connection path.

18. The packaged semiconductor device of claim 17, wherein
the first connection path has a second exposed bonding surface in the bottom surface of the RDL structure connected to one of the plurality of solder bumps, and
the first connection path provides an electrical connection between the wirebondable die and the electronic component.

19. The packaged semiconductor device of claim 16, wherein
the electronic component comprises a flip chip die.

20. The packaged semiconductor device of claim 16, further comprising:
a flip chip die having a second plurality of solder bumps, wherein the plurality of connection paths further have bonding surfaces exposed in a top surface of the RDL structure, and each of the second plurality of solder bumps are connected to a respective bonding surface in the top surface of the RDL structure, wherein the plurality of connection paths provide electrical connections between the flip chip die and the electronic component.

* * * * *